(12) United States Patent  
Balasingham et al.

(10) Patent No.: US 7,204,701 B1  
(45) Date of Patent: Apr. 17, 2007

(54) METHOD AND APPARATUS FOR REDUCING CAPACITIVELY COUPLED RADIO FREQUENCY ENERGY BETWEEN A SEMICONDUCTOR DEVICE AND AN ADJACENT METAL STRUCTURE

(75) Inventors: Wigneswaran W. Balasingham, Burlington, MA (US); Istvan Novak, Maynard, MA (US); Robert S. Moffett, Milton, MA (US); Daniel D. Gonsalves, Hudson, NH (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/795,728

(22) Filed: Mar. 8, 2004

(51) Int. Cl.
*H01R 12/00* (2006.01)
*H05K 1/00* (2006.01)

(52) U.S. Cl. .......................... 439/73; 361/704
(58) Field of Classification Search .................. 439/66, 439/73, 331; 361/704, 719
See application file for complete search history.

(56) References Cited

U.S. PATENT DOCUMENTS 5,493,702 A * 2/1996 Crowley et al. ......... 455/575.5
6,344,978 B1 * 2/2002 Komiya ....................... 361/816
6,809,929 B2 * 10/2004 Liu ............................. 361/704

* cited by examiner

Primary Examiner—Javaid H. Nasri
(74) Attorney, Agent, or Firm—Dorsey & Whitney LLP

(57) ABSTRACT

A bolster plate apparatus, used to secure a semiconductor device intermediate a printed circuit board and a heat sink apparatus, includes either an indentation or an open aperture into which a radio frequency absorptive material may be disposed. The absorptive material may be a ferrite material specifically selected to absorb frequencies in the range of the second to fourth harmonic of the processor clock signal frequency. The type of the ferrite material implanted in the bolster plate is selected to maximize the absorption of radio frequency energy, particularly that emitted at the pad vias on the underside of the printed circuit board, without affecting the signal integrity of the other pad connections. The shape of the cutout or aperture is also defined by the arrangement of RF emitting pads on the underside of the printed circuit board. The open aperture, without any absorptive material, effectively increases the distance between the source of the radio frequency energy and the metal body of the bolster plate, thereby reducing the amount of radio frequency energy absorbed by the bolster plate and the electromagnetic interference generated thereby. Also disclosed is a method for reducing the radiated emission from an adjacent semiconductor device by selectively removing pads from the undersurface of the PCB board to effectively reduce the sources of the radio frequency energy, and, therefore the amount of RF energy capacitively coupled with RF energy metal body of the bolster plate.

12 Claims, 14 Drawing Sheets

METHOD AND APPARATUS FOR REDUCING CAPACITIVELY COUPLED RADIO FREQUENCY ENERGY BETWEEN A SEMICONDUCTOR DEVICE AND AN ADJACENT METAL STRUCTURE

FIELD OF THE INVENTION

The present invention relates to the field of electromagnetic interference, and, more specifically, to a device for reducing the capacitively coupled radio frequency energy from semiconductor devices to adjacent metal structures.

BACKGROUND OF THE INVENTION

Packaged semiconductor devices, such as processors, utilize digital clocking to synchronize their interaction with other components in a computer the system. These clock signals have harmonic content, including second and fourth harmonics of the fundamental clock signal frequency, that is emitted when the clock signal is present. Any metal structure close to a packaged semiconductor device, such as a bolster plate used to secure the processor intermediate the printed circuit board (PCB) and a heat sink, absorbs the radio frequency (RF) energy at the various harmonic frequencies and becomes a source of electromagnetic interference (EMI). This effect is due to capacitive coupling of the radio frequency energy from the semiconductor devices to the adjacent metal structures. Unfortunately, it is often difficult to avoid metal structures close to semiconductor devices because of thermal and mechanical constraints placed on printed circuit board design and the number semiconductor devices populated thereon. A need exists for a technique to reduce the radiated emission of clock frequencies of a processor, particularly the 2nd harmonic component thereof, that are collected by metal structures within the proximity of a processor. Accordingly, an object of the invention is to reduce the capacitive coupling of the radio frequency energy from semiconductor devices to adjacent metal structures, particularly between a semiconductor device and its bolster plate.

SUMMARY OF THE INVENTION

A method and apparatus for reducing the radiated emission from a semiconductor device performing digital clocking to an adjacent metal structure is disclosed. An inventive bolster plate apparatus, used to secure a semiconductor device intermediate a printed circuit board and a heat sink apparatus, includes either an indentation or an open aperture into which a radio frequency absorptive material maybe disposed. The absorptive material may be a ferrite material specifically selected to absorb frequencies in the range of the second to fourth harmonic of the processor clock signal frequency. The type of the ferrite material implanted in the bolster plate is selected to maximize the absorption of radio frequency energy, particularly that emitted at the pad vias on the underside of the printed circuit board, without affecting the signal integrity of the other pad connections. The shape of the cutout or aperture is also defined by the arrangement of RF emitting pads on the underside of the printed circuit board. The open aperture, without any absorptive material, effectively increases the distance between the source of the radio frequency energy and the metal body of the bolster plate, thereby reducing the amount of radio frequency energy absorbed by the bolster plate and the electromagnetic interference generated thereby. Also disclosed is a method for reducing the radiated emission from an adjacent semiconductor device by selectively removing pads from the undersurface of the PCB board to effectively decrease the source(s) of the radio frequency energy, and, therefore, the capacitively coupled RF energy to the bolster plate.

According to a first aspect of the invention, an apparatus for securing a semiconductor device to a printed circuit board comprises: a substantially planar metal body having a predetermined thickness; means for securing the apparatus in proximity to a semiconductor device; and a radio frequency energy absorptive material disposed on the planar metal body. In the disclosed embodiments, the substantially planar metal body has at least one area of either geometric or irregular shape having a thickness less than the predetermined thickness into which the radio frequency energy absorbent material is disposed. The area having a thickness less than the predetermined thickness may be an aperture extending through the substantially planar metal body. In other disclosed embodiments, the substantially planar metal body has a plurality of areas of either geometric or irregular shape having a thickness less than the predetermined thickness into which the radio frequency energy absorbent material is disposed. In other embodiments, the radio frequency energy absorbent material may be a ferrite material. In yet other embodiments, the radio frequency energy emitted by the semiconductor device has a specific frequency component and the radio frequency energy absorptive material absorbs radio frequency energy in the range of the specific emitted frequency component.

According to a second aspect of the invention, an apparatus for securing a semiconductor device to a printed circuit board comprises: a substantially planar metal body having a predetermined thickness; means for securing the apparatus in proximity to a semiconductor device; and at least one aperture extending through the planar metal body and substantially aligned adjacent to the source of emitted radio frequency energy from the semiconductor device. In the disclosed embodiments, the aperture has either a geometric or irregular shape and may have a radio frequency energy absorbent material disposed therein. In other disclosed embodiments, the substantially planar metal body has a plurality of apertures. In other embodiments, the radio frequency energy emitted by the semiconductor device has a specific frequency component and the radio frequency energy absorptive material absorbs radio frequency energy in the range of the specific emitted frequency component.

According to a third aspect of the invention, a method for reducing capacitively coupled radio frequency energy from a semiconductor device to an adjacent metal structure comprises: (A) detecting a range of radio frequency energy emitted by the semiconductor device; (B) identifying a material that absorbs at least a portion of the radio frequency energy emitted by the semiconductor device; (C) coupling the identified absorptive material with the metal structure; and (D) securing the metal structure near the semiconductor device so that the absorptive material is exposed to the radio frequency energy emitted by the semiconductor device. In one embodiment, (B) comprises: (B1) selecting a subset of frequencies within the range of radio frequency energy emitted by the semiconductor device; and (B2) identifying a material that absorbs radio frequency energy in the selected subset of frequencies. In other embodiments, radio frequency energy emitted by the semiconductor device comprises a clock signal frequency and harmonics of the clock signal frequency and the selected subset of frequencies is selected from the set consisting of the fundamental, second harmonic and fourth harmonic of the clock signal frequency.

According to a fourth aspect of the invention, a method for reducing capacitively coupled radio frequency energy from a semiconductor device through a plurality of metal pads on a surface of a printed circuit board to an adjacent metal structure comprises: (A) detecting a range of radio frequency energy emitted by the semiconductor device; (B) providing a metal structure comprising: (i) a substantially planar body, (ii) at least one aperture extending through the planar body; and (iii) means for securing the metal structure to the printed circuit board; and (C) securing the metal structure adjacent the printed circuit board so that the at least one aperture is substantially aligned adjacent to the metal pads from which the radio frequency energy is emitted. In one embodiment, the method further comprises: (D) eliminating selected of the plurality of the metal pads on the surface of the printed circuit board. In other embodiments the provided metal structure further comprises: (iv) a radio frequency energy absorptive material coupled within the at least one aperture of the metal structure.

BRIEF DESCRIPTION OF THE DRAWINGS

The above and further advantages of the invention may be better understood by referring to the following description in conjunction with the accompanying drawings in which.

DETAILED DESCRIPTION

References in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
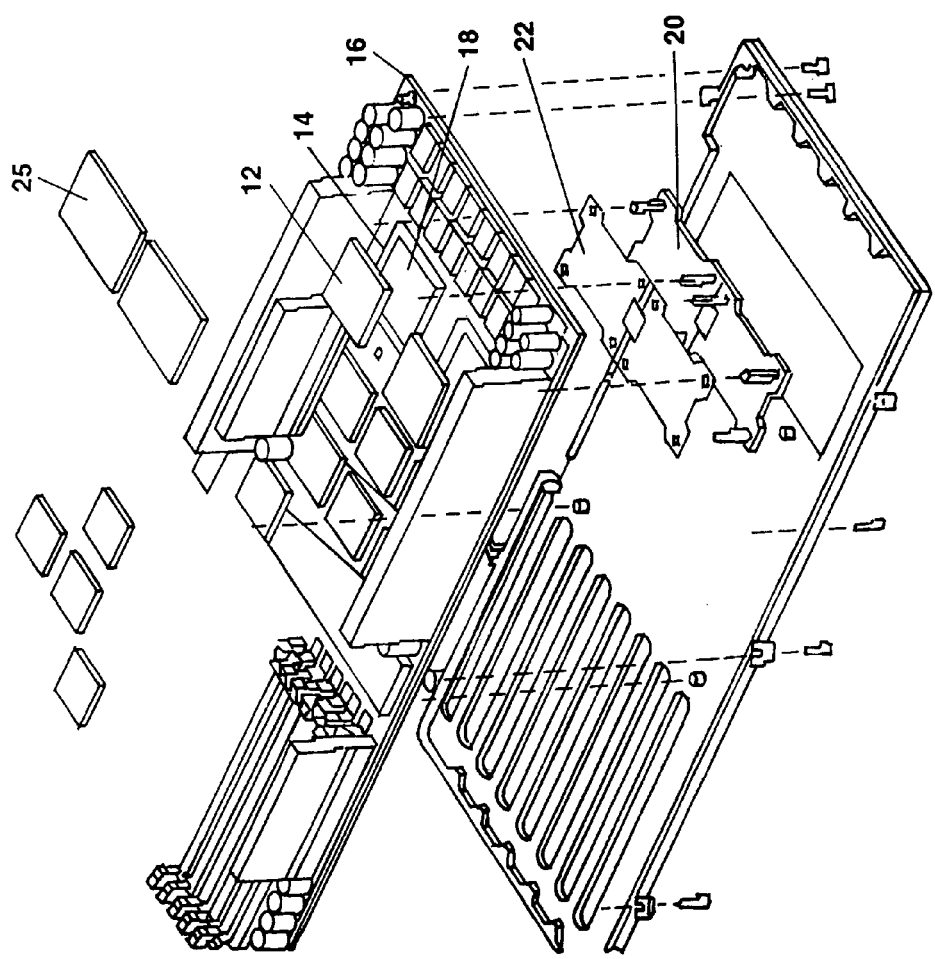
FIG. 1 is an exploded view of a prior art semiconductor device assembly illustrating the relationship between the semiconductor device and the printed circuit board.

FIG. 1 is an exploded view of a prior art central processing unit (CPU) module assembly, such as the Ultrasparc III™ processor modules, commercially available from Sun Microsystems, Santa Clara, Calif., illustrating the relationship between semiconductor device(s) and the printed circuit board. As illustrated, the CPU processor 12 is surrounded by a socket 14 and is sits on top of pads 18 formed in the upper surface of PCB board 16. A bolster plate 20 is inserted from the underside of PCB board 16, through holes in Mylar sheet 22 and through holes PCB board 16. Mylar sheet 22 electrically isolates bolster plate 20 from via pads/stubs (not shown) on the underside of PCB board 16. A socket 14 helps to align the processor 12 over the pads 18 on the upper surface of PCB board 16. A thermal pad 25 separates the top of processor 12 from heat sink 26 for better thermal conductivity. The heat sink 26 is secured, e.g. bolted down, to the legs of bolster plate 20 forcing processor 12 against pads 18 to ensure adequate electrical connection between the processor 12 and the PCB board 16.

In the assembly illustrated in FIG. 1, the RF energy from processor 12 is transmitted to pads 18, travels through the holes or vias (not shown) in PCB board 16 to the pads (also not shown) on the underside of PCB board 16 and gets capacitively coupled to the metal body of bolster plate 20, which, in turn, radiates the collected RF energy. This configuration emulates a capacitor model in which one side of the capacitor is the via pads/stubs on the underside of PCB board 16 and other side is the ungrounded bolster plate 20 separated by mylar sheet 22.

In accordance with the present invention, the capacitive coupling between the processor and the bolster plate is reduced, according to a first technique, by embedding an RF energy absorptive material in the bolster plate to reduce the amount of RF energy collected by the metal bolster plate, and, according to a second technique, by increasing the distance from the source of the emitted RF energy to the bolster plate. In addition, a third technique to reduce the capacitive coupling between the processor and the bolster plate is to remove selected of the pads on the underside of the printed circuit board. This third technique may be used alone or in conjunction with either of the first or second techniques described herein.

In order to implement the first technique, one or more frequencies of interest must be identified and an absorbent material capable of absorbing frequencies within that ranged selected. To begin, the strength of the RF leakage, typically at the bottom center of the processor 12, is measured. In the illustrative embodiment, a small hole is drilled through bolster plate 20 and mylar sheet 22, of the prior art configuration illustrated in FIG. 1. A coaxial cable can be fed through this small hole and connected to the center of CPU core voltage present at the via pads 21 (not shown) on the underside of PCB board 16. The coaxial cable can be connected in series with a capacitor, to eliminate DC voltage, and also connected to a spectrum analyzer. Next, the clock signal operating frequency is swept over a range of frequencies, e.g. from 1028 Mhz to 1296 Mhz, at 16 Mhz intervals. For each of the processor operating frequencies, the frequency of the 1st, 2nd, and 4th harmonics of the processor operating frequency can be measured, as well as the RF emission level for each of the 1st, 2nd, and 4th harmonics of processor operating frequencies.

An exemplary data set resulting up from the measurement technique described above is illustrated in graph of FIG. 2 in which the processor operating frequencies, measured in Megahertz (MHz), are plotted along the x-axis, and the emission levels for 1st, 2nd, and 4th harmonics of each processor's operating frequencies, measured in decibel/microVolts (dBuV), are plotted along y-axis. As illustrated, when the processor speed is increased from 900 Mhz to 1050 Mhz in the prior art configuration, the radiated emission also increases. The processor 12 running at 1050 Mhz is the worst case for radiated emission. Of particular interest with the exemplary data set is the level of RF radiation at the 2nd harmonics of the processor clock signal frequency of 1050 Mhz.

Figure 4A:
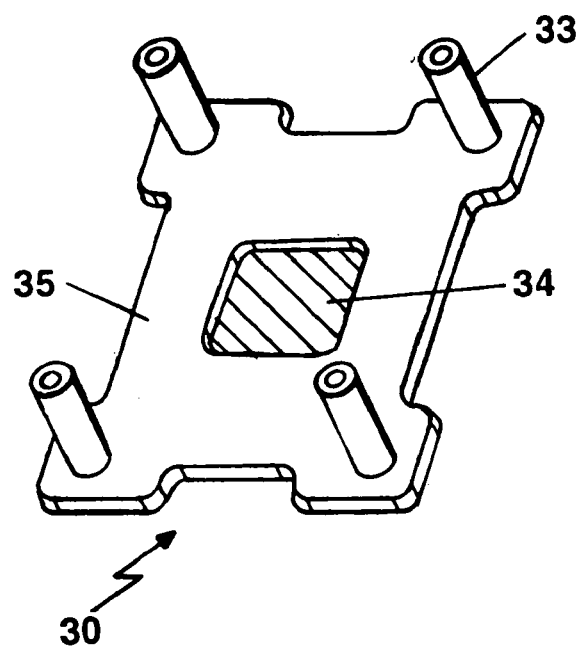
FIGS. 4A–B are perspective and side cross-sectional views, respectively, of a bolster plate apparatus with absorptive material in accordance with the present invention.
Figure 4B:
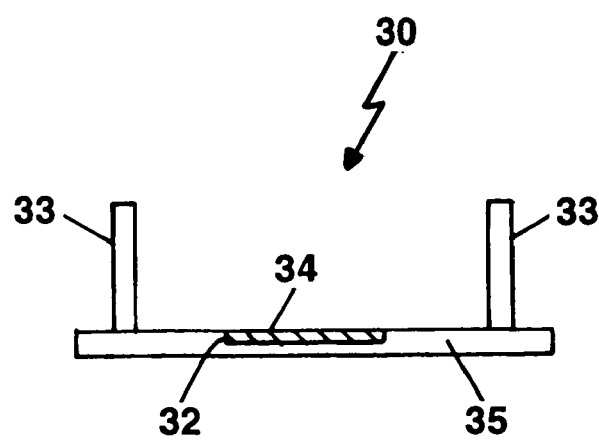

According to the first technique of the invention, energy coupling between the via pads and the bolster plate is reduced by placing one or more layers of RF absorbent material, such as a ferrite material, between the pad/stubs and bolster plate 20. Referring to FIGS. 4A–B, a bolster plate 30, in accordance with the present invention, includes a base or planar body 35 having a substantially uniform predetermined thickness and a plurality of posts 33 extending outward therefrom. The free ends of posts 33 may be threaded to receive a screw or other fastening device for securing to a heat sink apparatus. An indentation 32, i.e a region of reduced thickness, extends partially through the base 35. In the illustrative embodiment, the bolster plate 30, including posts 33 and planar body 35, may be manufactured as a unitary object from any of the number of metallic materials.

An RF energy absorbent material 34 is disposed within the indentation 32 to absorb some of the RF energy coming out of via pads/stubs 21 on the underside of the PCB board 16. As the frequency of the semiconductor device clock signal changes, the most prominent harmonic thereof and the spectrum of radiated RF energy will also change. Accordingly, the absorbent material 34 should be selected for the greatest absorption of the particular selected frequency range of interest. In the illustrative embodiment, RF energy absorbent material 34 may be implemented with a ferrite material selected to absorb RF energy in the approximate frequency range of the second harmonic of the clock signal. An absorbent material suitable for use with the present invention is the C-RAM FDSS or C-RAM GDSS products commercially available from Cuming Microwave Corporation, Avon, Mass. 02322. These products comprise magnetically filled, electrometric materials with a high magnetic loss for suppression of surface waves. The C-RAM FDSS product has a high magnetic loss tangent from about 300 MHz to 3 GHz, while the C-RAM GDSS product has a high magnetic loss tangent from about 1 GHz to 20 GHz. In the illustrative embodiments, the RF energy absorbent material may be frictionally retained within the indentation 32 or coupled therein either mechanically and/or chemically. It will be obvious to those recently skilled in the arts that other RF energy absorbent material may be used as material 34, including carbon filled based foam absorbers; rigid and castable absorbers, such as iron filled epoxy; and sprayable or paintable absorbers made of iron loaded urethane, silicon or epoxy binders. Note that in the case of castable, sprayable or paintable absorbent materials, the material may be applied directly to the surface of the exposed base surface of bolster plate 20 without the need for a reduction in the thickness of the bolster plate base.

Figure 3:
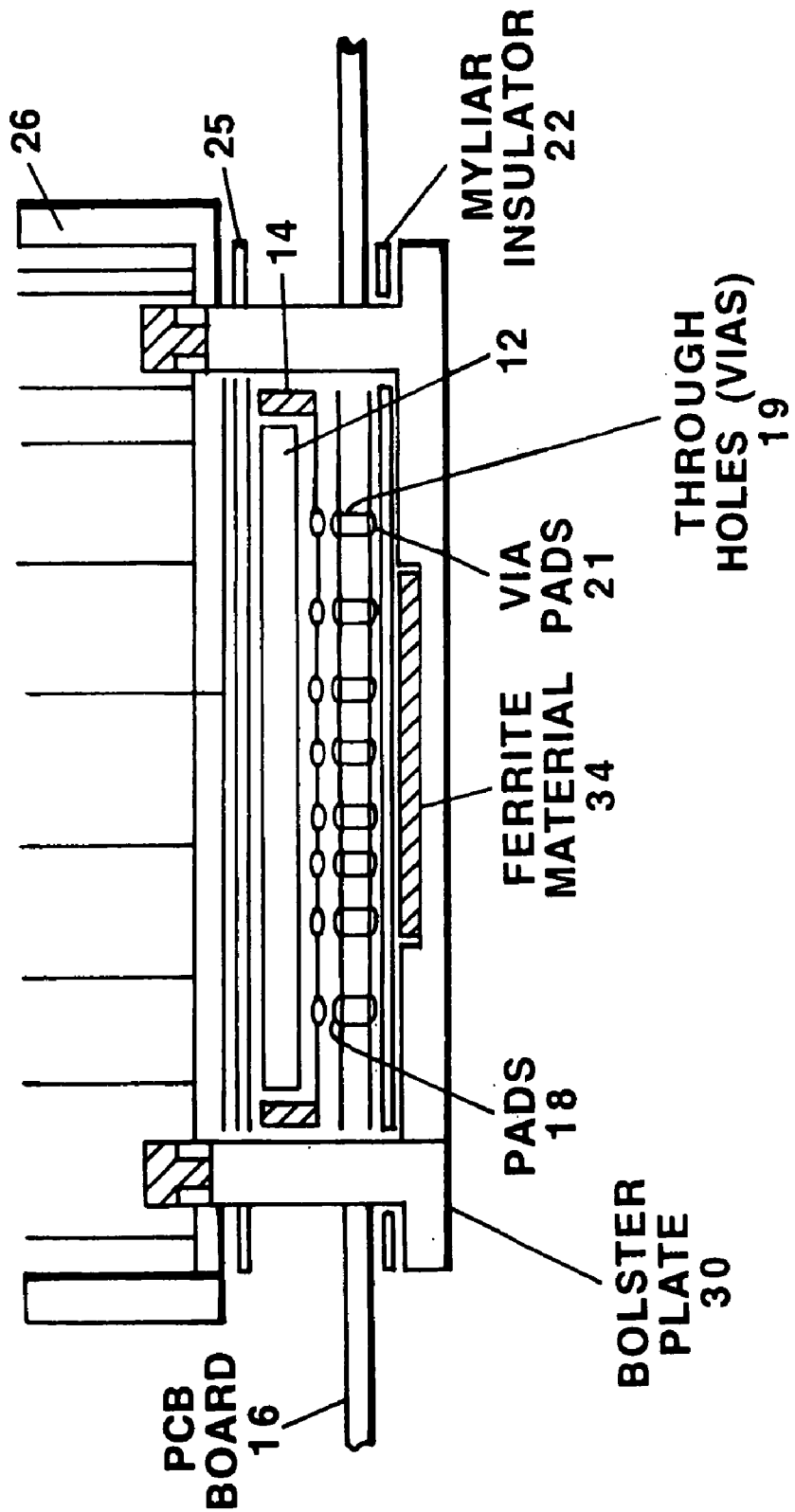
FIG. 3 illustrates a cross-sectional view of the inventive bolster plate in relation to the semiconductor device, the printed circuit board and other system components in accordance with present invention.

In FIG. 3, a representative number of pads 18, through holes or vias 19 and the via pads 21 are illustrated. Typically, hundreds of pads 18 and vias 19 are formed into PC board 16 in a rectangular array that comprises the electrical connections on which the processor 12 resides. Typically, the pads through which the processor receives the core voltage are located towards the center of the rectangular array, hence the generally rectangular shape of indentation 32 of the inventive bolster plate 30. In the illustrative embodiment, the shape of indentation 32 and the location within the bolster plate 30 is selected to place the indentation in the region that is situated directly below semiconductor device power core voltage, once the bolster plate 30 is secured through the PCB board 16, as illustrated in greater detail with reference to FIG. 3. It will be obvious to those reasonably skilled in the arts, however, that when the configuration of the pads that are responsible for radiating RF energy are configured in a different shape or pattern on PCB board 16, the shape of indentation 32 will be of a different configuration.

FIG. 3 illustrates a cross-sectional view of the inventive bolster plate 30 in relation to the semiconductor device, the printed circuit board and other system components in accordance with present invention. In the exemplary embodiment, the processor 12, which may be a central processing unit, rests atop pads 18 formed on the upper surface of PCB board 16 and within socket 14. A plurality of via 19 extends through PCB board 16 and are terminated at the underside thereof with pads 21. Mylar sheet 22 is disposed intermediate pads 21 and bolster plate 30. As in the prior art configuration of FIG. 1, a thermal pad 25 separates the top of processor 12 from heat sink 26 for better thermal conductivity. Bolster plate 30 is inserted from the underside of PCB board 16, through holes in Mylar sheet 22 and through PCB board 16 and aligned with heat sink 26, so that the absorbent material 34 disposed within the indentation 32 of bolster plate 30 is substantially aligned with the pads 21 that are the source of emitted RF radiation. The heat sink 26 is secured, e.g. bolted down, to the posts 33 of bolster plate 30 forcing processor 12 against pads 18 to ensure adequate electrical connection between the processor 12 and the PCB board 16.

Table 1 below illustrates the experimental results utilizing the sample data set of FIG. 2 and the inventive bolster plate of FIGS. 3 and 4A–B. As shown, the RF absorption material 34 provides a reduction of radiated emission at selected frequencies, but that the level of attenuation is frequency dependent. This is due to an increase in the separation between via pads/stubs 21 and bolster plate 30 thus reducing the capacitance therebetween. When selecting the right RF absorption materials, as well as the size and shape of the absorbent material, consideration should be given to the clock frequency and harmonic thereof of interest, for optimal results.

TABLE 1

| CPU Frequency (MHz) | 2nd Harmonic of CPU Freq. (MHz) | Without RF absorption & with CPU via pads (dBuV) | With RF Absorption & with CPU via pads (dBuV) |
|---|---|---|---|
| 897 | 1792 (H) | 37.7 | 39.6 |
|  | 1792 (V) | 33.9 | 33.1 |
| 1050 | 2100 (H) | 35.8 | 34.4 |
|  | 2100 (V) | 38.5 | 34.4 |
| 1197 | 2394 (H) | 42.7 | 41.5 |
|  | 2394 (V) | 36.6 | 36.3 |

Figure 5A:
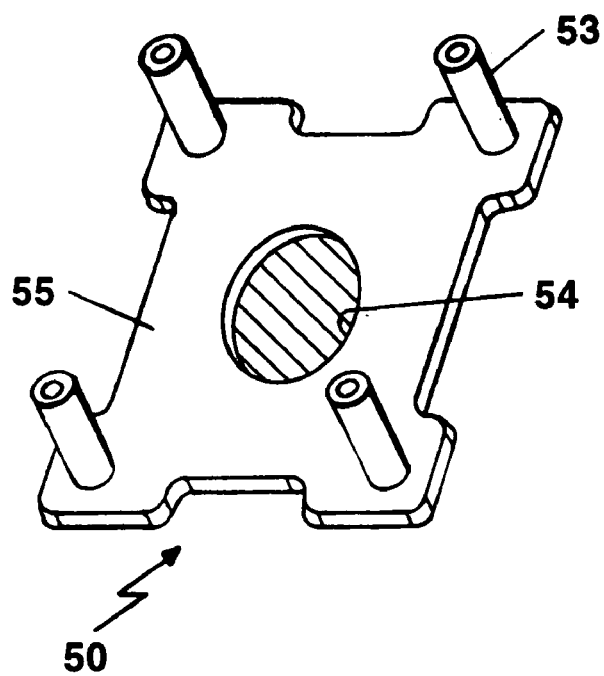
FIGS. 5A–B are perspective and side cross-sectional views, respectively, of another embodiment of a bolster plate apparatus with a region of absorptive material of a different shape.
Figure 5B:
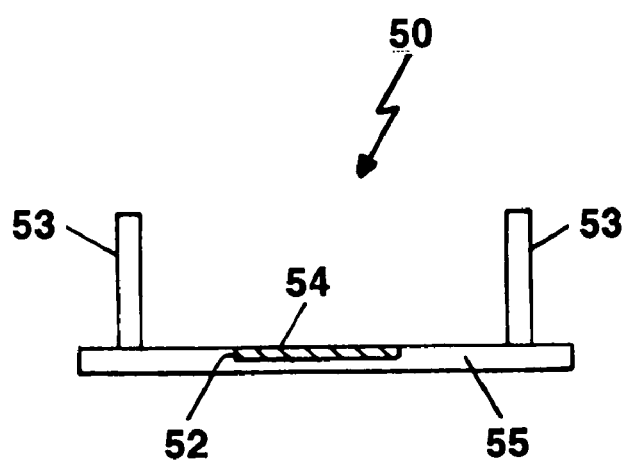
Figure 6A:
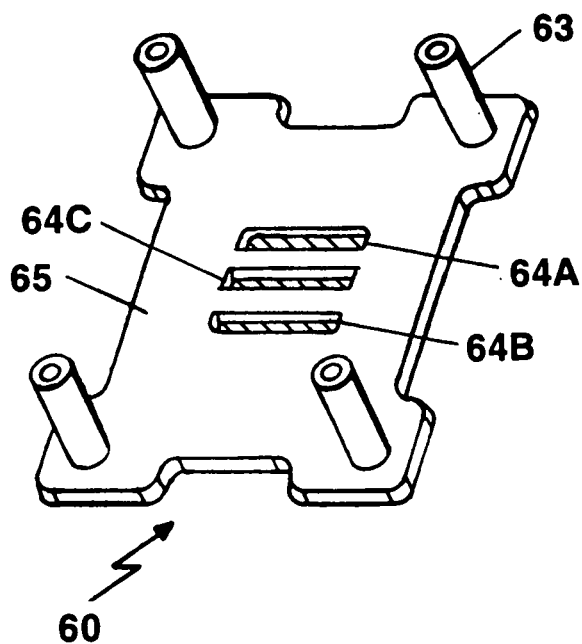
FIGS. 6A–B are perspective and side cross-sectional views, respectively, of another embodiment of a bolster plate apparatus with a region of absorptive material of a different shape.
Figure 6B:
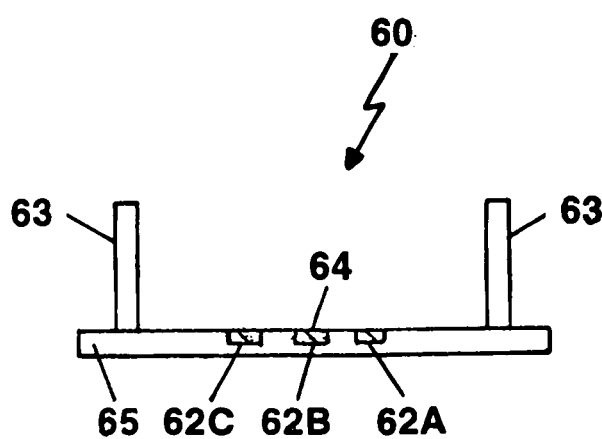
Figure 7A:
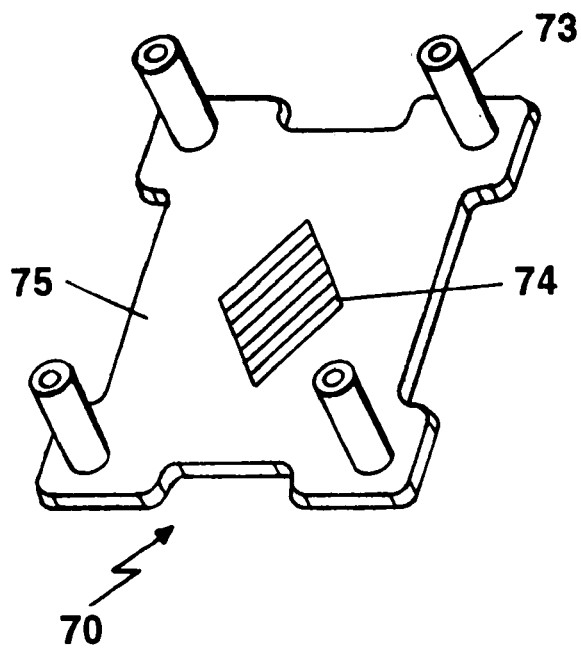
FIGS. 7A–B are perspective and side cross-sectional views, respectively, of another embodiment of a bolster plate apparatus with a plurality of regions of absorptive material.
Figure 7B:
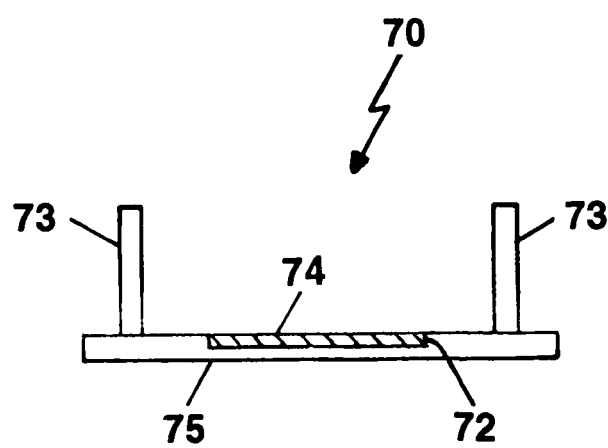
Figure 8A:
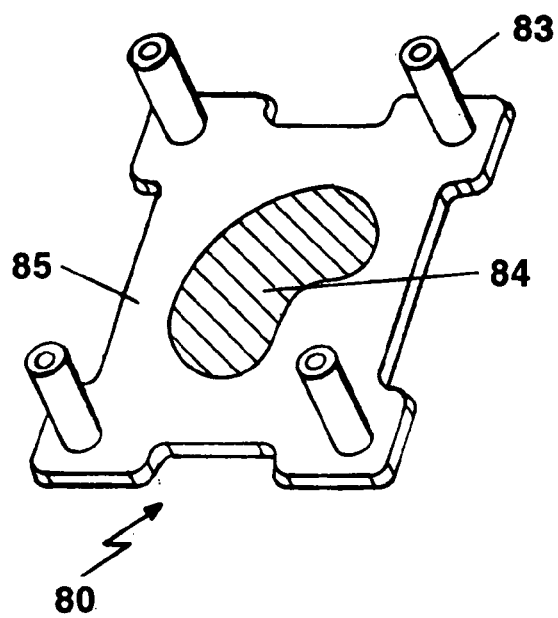
FIGS. 8A–B are perspective and side cross-sectional views, respectively, of another embodiment of a bolster plate apparatus with a region of absorptive material of a different shape.
Figure 8B:
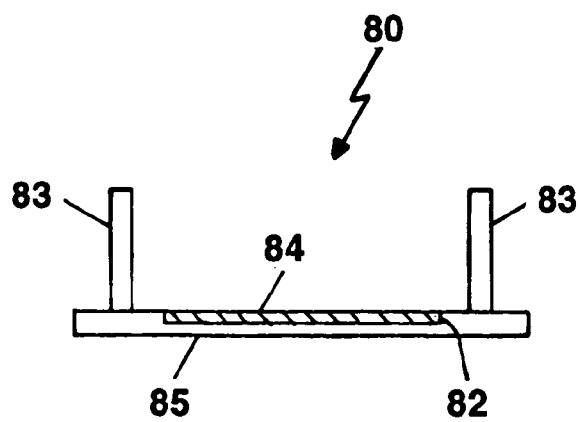
Figure 8C:
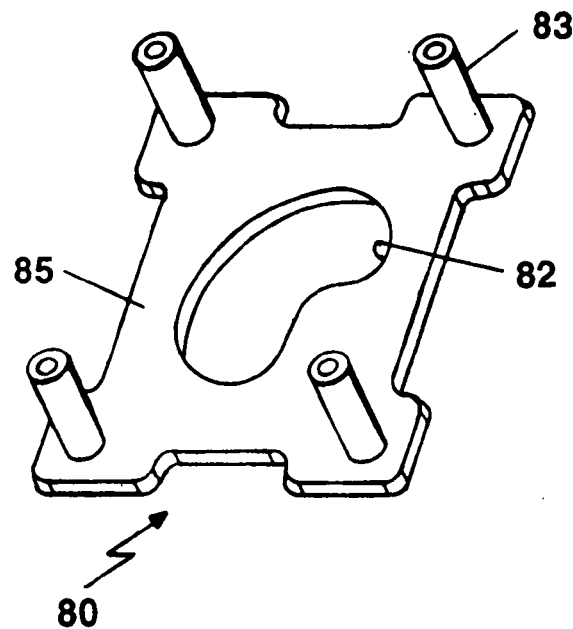
FIGS. 8C–D are perspective and side cross-sectional views, respectively, of an alternative embodiment of the bolster plate apparatus of FIG. 8A without absorptive material and with an aperture extending therethrough.
Figure 8D:
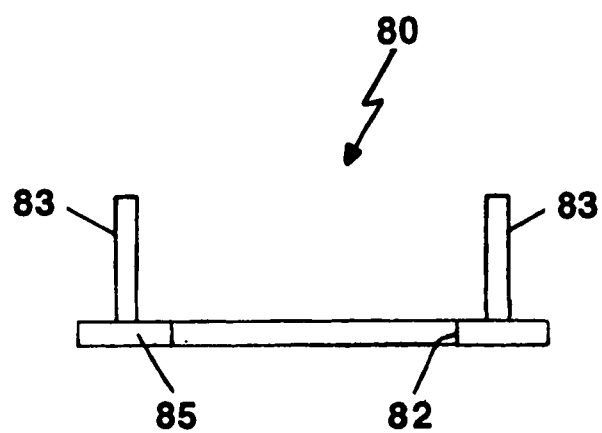

Some alternative embodiments of the inventive bolster plate 30 of FIGS. 4A–B are shown in FIGS. 5A–B, 6A–B, 7A–B, and 8A–B. In these alternative embodiments, the shape of the indentations in the base of the bolster plate have either geometric or irregular shapes. In FIGS. 5A–B, a bolster plate 50 includes a base 55, posts 53 and an ovoid or circular indentation 52 into which absorptive material 54 is disposed and retained. In FIGS. 6A–B, a bolster plate 60 includes a base 65, posts 63 and a plurality of elongate indentations 62A–C into which absorptive materials 64A–C are disposed and retained, respectively. In FIGS. 7A–B, a bolster plate 70 includes a base 75, posts 73 and a diamond shaped indentation 72 into which absorptive material 74 is disposed and retained. In FIGS. 8A–B, a bolster plate 80 includes a base 85, posts 83 and an irregular shaped indentation 82 into which absorptive material 84 is disposed and retained. Note that indentation 82 is not symmetrical and not of a geometric shape. The various indentation shapes shown in the Figures are for illustrative purposes only and are not meant to be limiting. It will be obvious to those reasonably in the arts that any shaped indentation may be utilized, with the shape being optimized for mitigating the RF radiation emitted from the configuration of the pads 21 on the undersurface of PCB board 16. Any shape that can be machined or formed into the base of a bolster plate may be utilized, if appropriate for the spectrum of RF emissions. Further, the indentation and the absorptive material disposed therein may be located anywhere on the base of the bolster plate, including along an edge thereof.

Figure 4C:
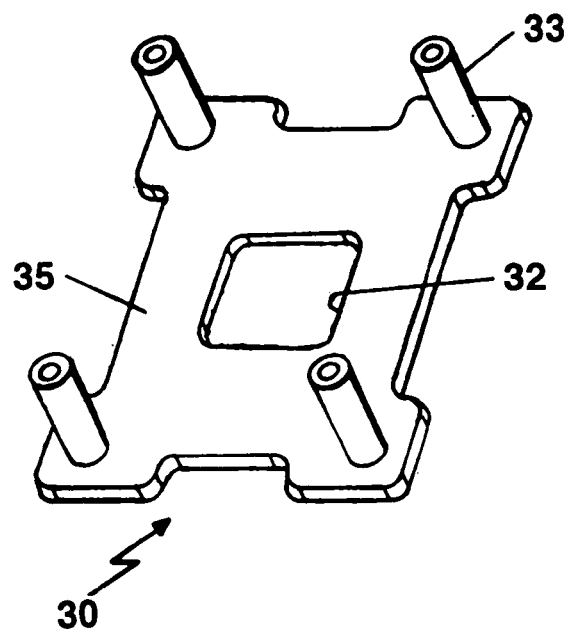
FIGS. 4C–D are perspective and side cross-sectional views, respectively, of an alternative embodiment of the bolster plate apparatus of FIG. 4A without absorptive material and with an aperture extending therethrough.
Figure 4D:
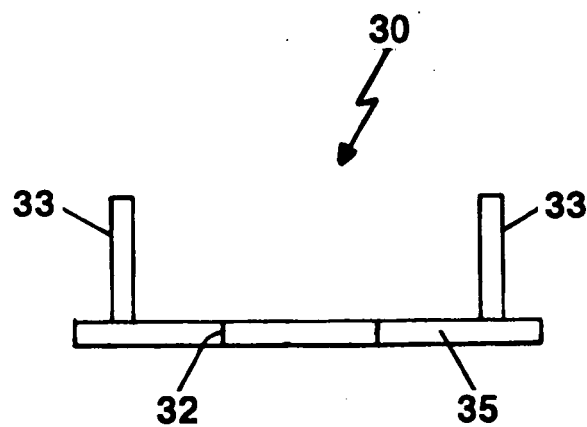
Figure 9:
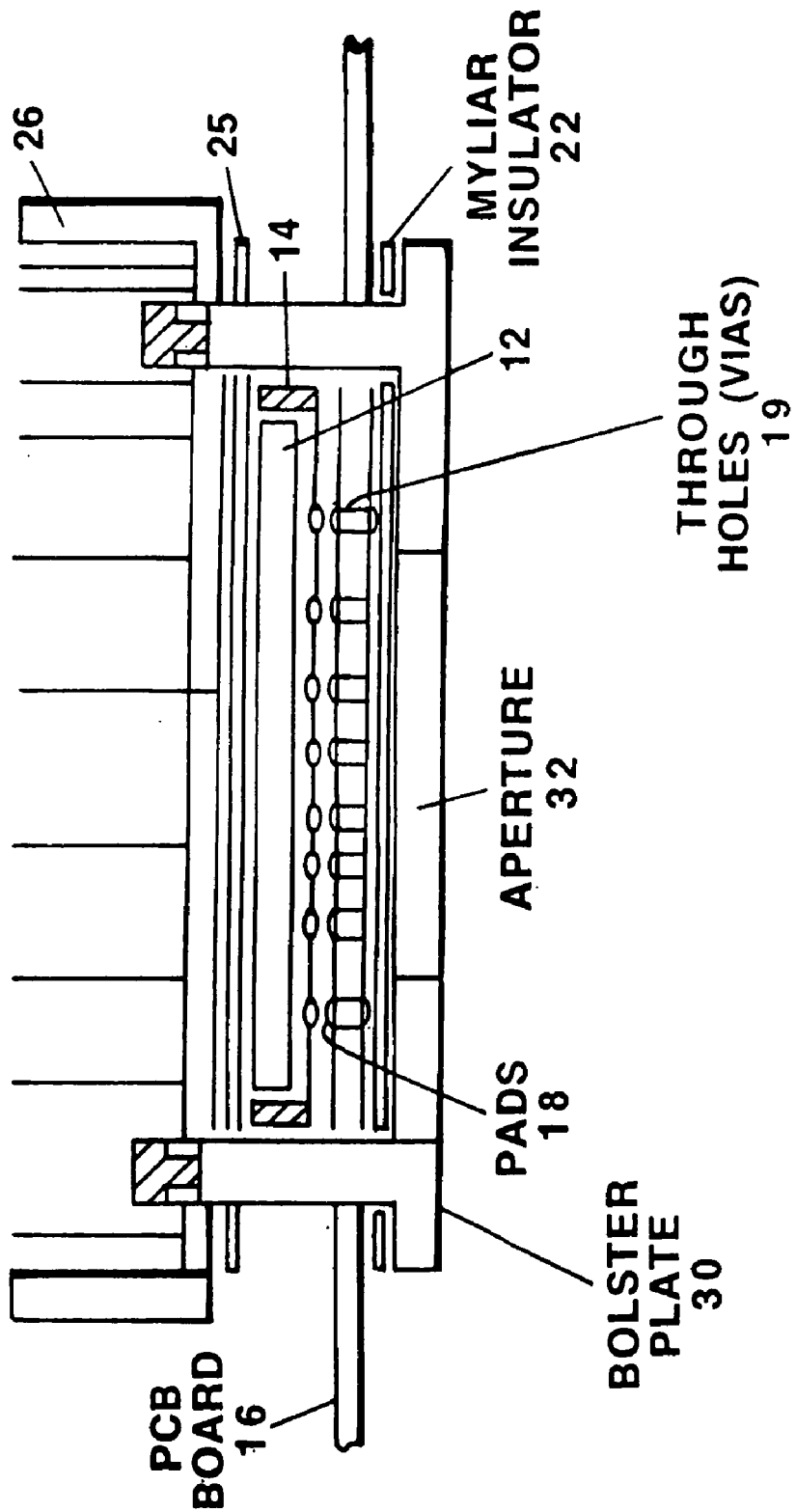
FIG. 9 illustrates a cross-sectional view of the inventive bolster plate of FIGS. 4C–D in relation to the semiconductor device and a printed circuit board with selected of the via pads removed from the underside thereof.

According to the second inventive technique, energy coupling between the via pads and the bolster plate is reduced by increasing the distance from the pad and stubs on the underside of the printed circuit board to the metal base of bolster plate 30. Referring to FIGS. 4C–D, a bolster plate 30 substantially similar to the bolster plate 30 of FIGS. 4A–B is shown, except that indentation 32 extends completely through the base 35 to form an open aperture. In the embodiments of FIGS. 4C–D, the bolster plate 30, including posts 33 and planar body 35, may be manufactured as a unitary object from any of the number of metallic materials. FIG. 9 illustrates a cross-sectional view of the inventive bolster plate of FIGS. 4C–D in relation to the semiconductor device and the printed circuit board with selected of the via pads removed. The bolster plate 30 is mounted to PCB board 16 similarly as described with reference to FIG. 3. Table 2 illustrates the experimental results utilizing the sample data set of FIG. 2 and the inventive bolster plate of FIGS. 4C–D. As shown, significant radiated emission reduction at some frequencies occurs due to the increased separation between via pads/stubs 21 and base 35 of the bolster plate and the reduced capacitance therebetween.

TABLE 2

| CPU Frequency (MHz) | 2nd Harmonic of CPU Freq. (MHz) | Without cavity bolster plate & With CPU via pads (dBuV) | With cavity bolster plate & with CPU via pads (dBuV) |
|---|---|---|---|
| 897 | 1792 (H) | 39.3 | 37.7 |
|  | 1792 (V) | 38.8 | 33.9 |
| 1050 | 2100 (H) | 45 | 35.8 |
|  | 2100 (V) | 44.5 | 38.5 |
| 1197 | 2394 (H) | 40.2 | 42.7 |
|  | 2394 (V) | 39.4 | 36.6 |

Figure 5C:
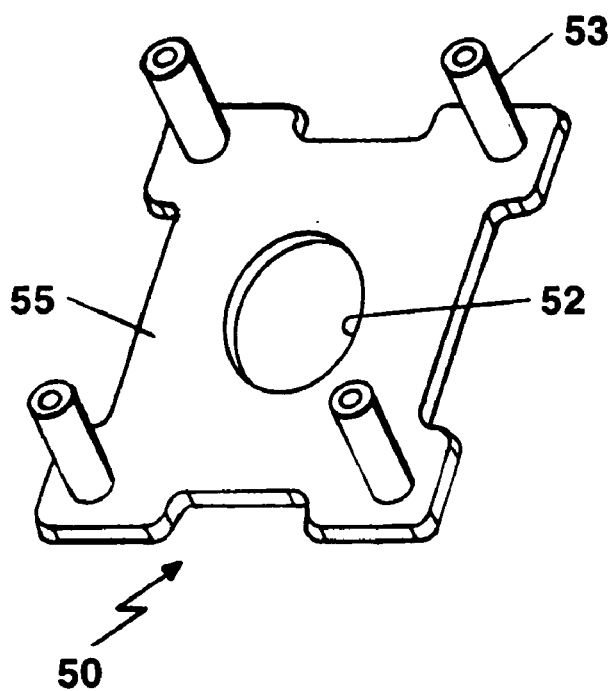
FIGS. 5C–D are perspective and side cross-sectional views, respectively, of an alternative embodiment of the bolster plate apparatus of FIG. 5A without absorptive material and with an aperture extending therethrough.
Figure 5D:
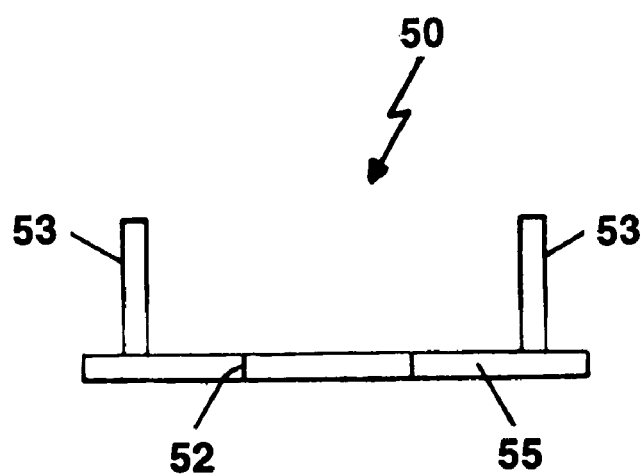
Figure 6C:
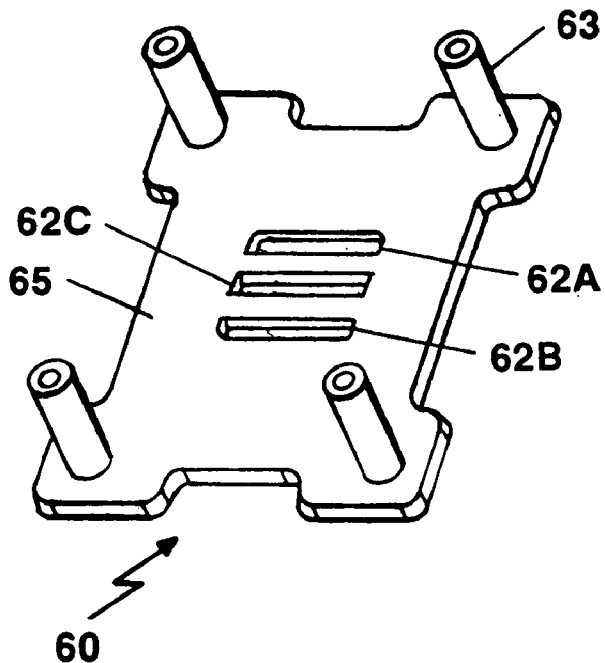
FIGS. 6C–D are perspective and side cross-sectional views, respectively, of an alternative embodiment of the bolster plate apparatus of FIG. 6A without absorptive material and with an aperture extending therethrough.
Figure 6D:
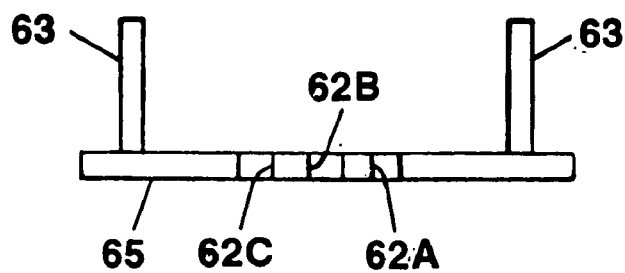
Figure 7C:
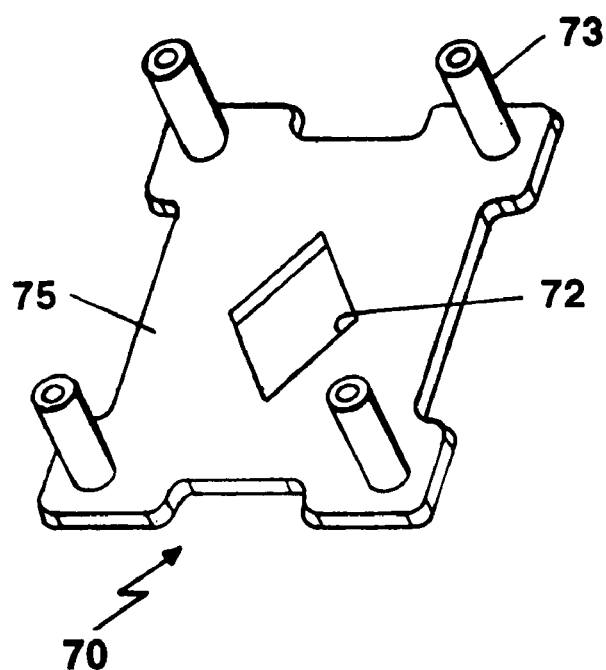
FIGS. 7C–D are perspective and side cross-sectional views, respectively, of an alternative embodiment of the bolster plate apparatus of FIG. 7A without absorptive material and with a plurality of apertures extending therethrough.
Figure 7D:
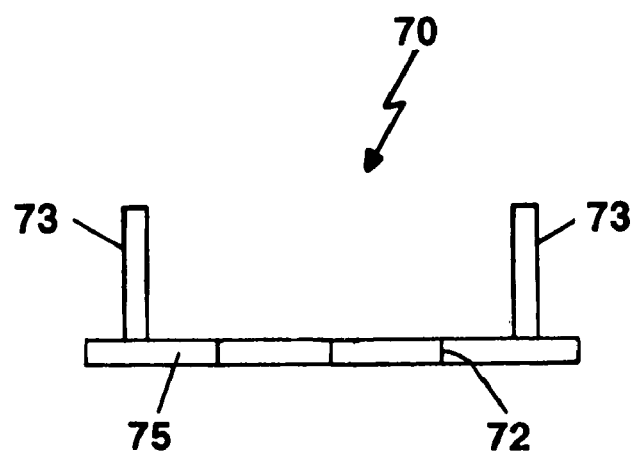

Some alternative embodiments of the inventive bolster plate 30 of FIGS. 4C–D are shown in FIGS. 5C–D, 6C–D, 7C–D, and 8C–D. In these alternative embodiments, the shape of the apertures in the base of the bolster plate have either geometric or other shapes. In FIGS. 5C–D, a bolster plate 50 includes a base 55, posts 53 and an ovoid or circular aperture 52. In FIGS. 6C–D, a bolster plate 60 includes a base 65, posts 63 and a plurality of elongate apertures 62A–C. In FIGS. 7C–D, a bolster plate 70 includes a base 75, posts 73 and a diamond shaped aperture 72. In FIGS. 8 C–D, a bolster plate 80 includes a base 85, posts 83 and an irregular shaped aperture 82. Note that aperture 82 is not symmetrical and not of a geometric shape. The various aperture shapes shown in the Figures are for illustrative purposes only and are not meant to be limiting. It will be obvious to those reasonably in the arts that any shaped aperture may be utilized, with the shape being optimized for mitigating the RF radiation emitted from the configuration of the pads 21 on the undersurface of PCB board 126. Again, any shape that can be cut out of the base of a bolster plate may be utilized, if appropriate for the spectrum of RF emissions. In addition, the aperture may be located anywhere on the base of the bolster plate, including along an edge thereof.

In accordance with yet another alternative embodiment, an RF energy absorbent material may be disposed within any of the apertures shown in FIGS. 4C–D, 5C–D, 6C–D, 7C–D, and 8C–D to absorb some of the RF energy coming out of via pads/stubs 21 on the underside of the PCB board 16, thus reducing the RF energy coupling from the processor. In such embodiments the RF energy absorbent material may be frictionally retained within the aperture of mechanically or chemically attached along the edges of the aperture.

According to the third inventive technique, energy coupling between the via pads 21 and the bolster plate is reduced by removing selected of the pads on the underside of the printed circuit board, or, alternatively, manufacturing the printed circuit board without pads on at least a portion of the undersurface thereof, particularly beneath the core power pads of a semiconductor device on the opposite surface. FIG. 9 illustrates a cross-sectional view of a bolster plate in relation to the semiconductor device and the printed circuit board with selected of the via pads eliminated. One or all of the pads 21 within a specific region may be removed and the vias 19 extending through PCB board 16, left open or filled with an absorptive material similar to absorptive material 34 used in the inventive bolster plates described herein. Alternatively, at the time the PCB board is designed and manufactured, selected pads may be suppressed or not formed on the undersurface of the PCB board in the appropriate region(s), either with or without vias. Within this technique, the radiated RF energy is emitted from the pads 18 on the top surface of the PCB board and has to travel through the vias 19, or, if no vias are present, through the PCB board itself, before reaching the base of the bolster plate. Similar to the second technique, this technique effectively increases the distance from the source of the RF energy on the printed circuit board to the metal base of the bolster plate.

Figure 2:
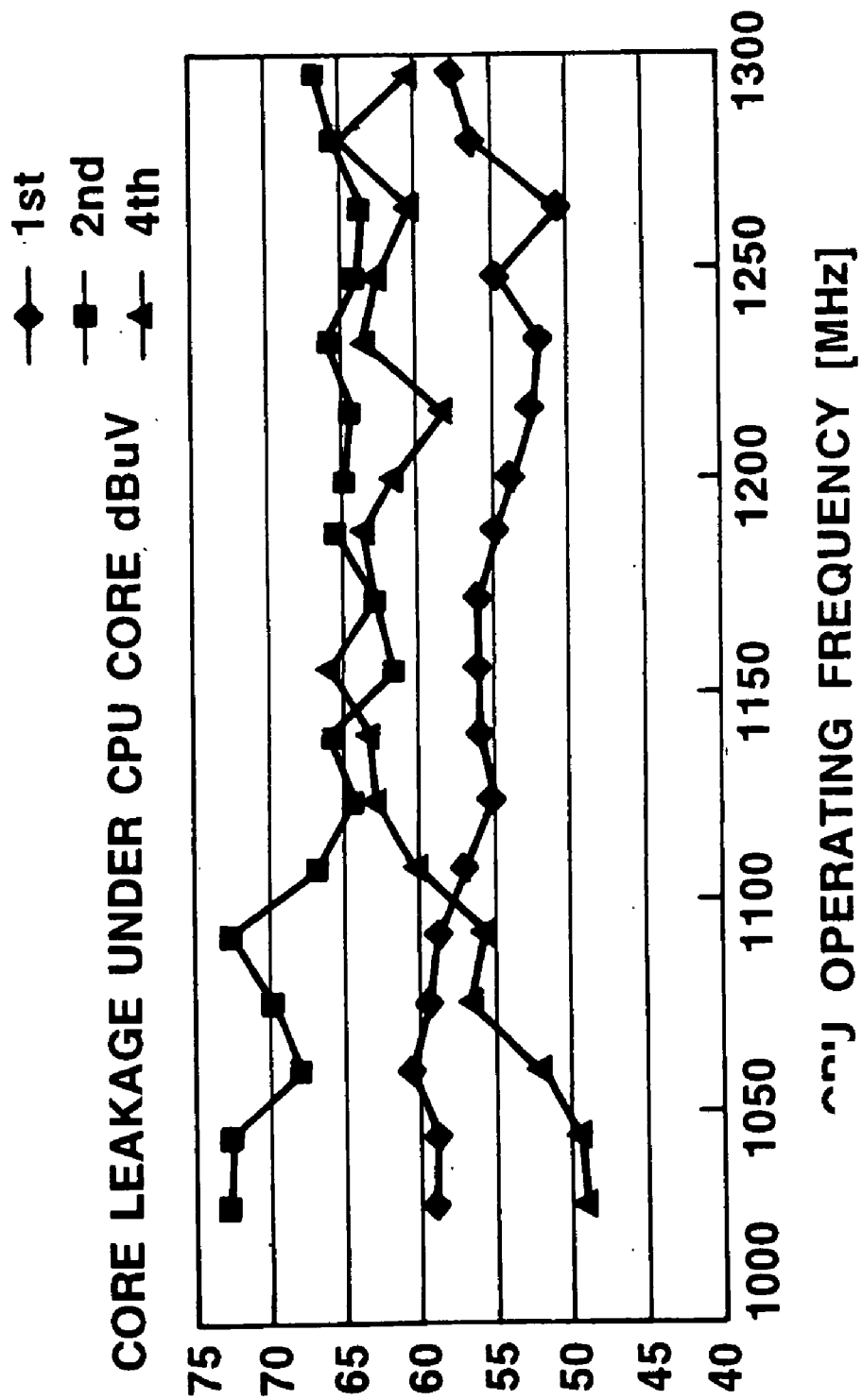
FIG. 2 illustrates graphs of experimental data showing the radiated amplitude of the fundamental, second and fourth harmonics of an exemplary processor clock signal operating at a range of various frequencies.

Table 3 illustrates the experimental results utilizing the sample data set of FIG. 2 and with the removal of the pads 21 on the underside of the PCB board 16 in a substantially rectangular array representing those pads directly connected to the core voltage pads 18 by vias 19.

TABLE 3

| CPU Frequency (MHz) | 2nd Harmonic of CPU Freq. (MHz) | With CPU via pads (dBuV) | CPU via pads removed (dBuV) |
|---|---|---|---|
| 897 | 1792 (H) | 39.3 | 36.6 |
|  | 1792 (V) | 38.8 | 32.1 |
| 1050 | 2100 (H) | 45 | 36.4 |
|  | 2100 (V) | 44.5 | 38 |
| 1197 | 2394 (H) | 40.2 | 42.3 |
|  | 2394 (V) | 39.4 | 37.1 |

The results with and without CPU core voltage pads indicated there is a significant reduction with 900 Mhz and 1050 MHz CPU clock frequencies. This solution can be also implemented with blind vias to avoid pads at the bottom of the PCB board. Even though this solution provides a reduction in radiation, it involves an additional manufacturing step to remove the pads. Although the results of Table 3 are for just the third technique, removal of the pads 21 may be used alone or in conjunction with either of the first or second techniques described herein, as illustrated in FIG. 9.

It will be obvious to those recently skilled in the arts that one or more of the techniques described in this application may be combined to achieve maximum emission reduction or used with other techniques. For example, in addition to utilization of one of the inventive bolster plate embodiments described herein, the thickness of Mylar sheet 22 may be increased to provide further insulation of the bolster plate from the RF emissions emanating from pads 19.

Although the invention has been described with reference to a semiconductor device which functions as a processor, it will be obvious to those recently skilled in the arts any semiconductor device, including an integrated circuit, a processor, an Application Specific Integrated Circuit (ASIC) and the like, may experience the benefits of the inventive apparatus is described herein. Further, although the invention has been described with reference to bolster plates, it will be obvious to those recently skilled in the arts any metal structure close enough to receive RF energy radiated from a semiconductor device, may benefit from the inventive techniques described herein and show in the Figures. In addition, the techniques of the present invention are not limited to reduction of RF emission at just the 1st, 2nd, or 4th harmonic of the clock signal frequency. Reduction of RF emission at any frequency, whether it has a harmonic relationship to the clock signal frequency or not, can be achieved using the techniques of the present invention.

Although various exemplary embodiments of the invention have been disclosed, it will be apparent to those skilled in the art that various changes and modifications can be made which will achieve some of the advantages of the invention without departing from the spirit and scope of the invention. Further, many of the system components described herein have been described using products from Sun Microsystems Corporation. It will be obvious to those reasonably skilled in the arts that other components performing the same functions may be suitably substituted. Further, are the methods of the invention may be achieved in either all software implementations, using the appropriate processor instructions, or in hybrid implementations which utilize a combination of hardware logic and software logic to achieve the same results. Such modifications to the inventive concept are intended to be covered by the appended claims.

What is claimed is:

1. An apparatus for securing a semiconductor device to a printed circuit board, the apparatus comprising:
   a substantially flat metal body having a predetermined thickness, the substantially flat metal body further having at least one area having a thickness less than the predetermined thickness;
   a plurality of cylindrical posts extending from the flat metal body and configured to secure the flat metal body in proximity to a semiconductor device while allowing airflow around said plurality of cylindrical posts and between the semiconductor device and the flat metal body; and
   a radio frequency energy absorptive material disposed within the at least one area having a thickness less than the predetermined thickness.

2. The apparatus of claim 1 wherein the at least one area of the substantially flat metal body having a thickness less than the predetermined thickness has a geometric shape.

3. The apparatus of claim 1 wherein the at least one area of the substantially planar metal body having a thickness less than the predetermined thickness has an irregular shape.

4. The apparatus of claim 1 wherein the substantially planar metal body has a plurality of areas each having thicknesses less than the predetermined thickness.

5. The apparatus of claim 4 wherein the absorptive material is disposed within the plurality of areas each having thicknesses less than the predetermined thickness.

6. The apparatus of claim 1 wherein the radio frequency energy absorptive material is a ferrite material.

7. The apparatus of claim 1 wherein radio frequency energy emitted by the semiconductor device has a specific frequency component and wherein the absorptive material absorbs radio frequency energy in the range of the specific frequency component.

8. The apparatus of claim 1 wherein the specific frequency component of the radio frequency energy emitted by the semiconductor device comprises a harmonic of the clock signal frequency.

9. A method for reducing capacitively coupled radio frequency energy from a semiconductor device to an adjacent metal structure, the method comprising:
   (A) detecting a range of radio frequency energy emitted by the semiconductor device;
   (B) identifying a material that absorbs at least a portion of the radio frequency energy emitted by the semiconductor device;
   (C) coupling the identified absorptive material with a substantially flat metal structure having a plurality of posts extending outwardly therefrom, having a predetermined thickness, the substantially flat metal body further having at least one area having a thickness less than the predetermined thickness, the absorptive material within the at least one area having a thickness less than the predetermined thickness; and
   (D) securing the substantially flat metal structure near the semiconductor device so that the absorptive material is exposed to the radio frequency energy emitted by the semiconductor device and to allow airflow around said plurality of posts and between the semiconductor device and the flat metal structure.

10. The method of claim 9 wherein (B) comprises:
(B1) selecting a subset of frequencies within the range of radio frequency energy emitted by the semiconductor device; and
(B2) identifying a material that absorbs radio frequency energy in the selected subset of frequencies.

11. The method of claim 10 wherein the range of radio frequency energy emitted by the semiconductor device comprises a clock signal frequency and harmonics of the clock signal frequency.

12. The method of claim 11 wherein the subset of frequencies is selected from the set consisting of the fundamental, second harmonic and fourth harmonic of the clock signal frequency.

* * * * *